(12) United States Patent
Sarma et al.

(10) Patent No.: US 6,933,204 B2
(45) Date of Patent: Aug. 23, 2005

(54) METHOD FOR IMPROVED ALIGNMENT OF MAGNETIC TUNNEL JUNCTION ELEMENTS

(75) Inventors: Chandrasekhar Sarma, Poughkeepsie, NY (US); Sivananda K. Kanakasabapathy, Hopewell Junction, NY (US); Ihar Kasko, Fishkill, NY (US); Greg Costrini, Hopewell Junction, NY (US); John P. Hummel, Millbrook, NY (US); Michael C. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,604

(22) Filed: Oct. 13, 2003

(65) Prior Publication Data

US 2005/0079683 A1  Apr. 14, 2005

(51) Int. Cl.⁷ .............................................. H01L 21/76
(52) U.S. Cl. ...................................... 438/401; 438/622
(58) Field of Search ............................... 438/401, 443, 438/453, 523, 533, 551, 622, 942

(56) References Cited

U.S. PATENT DOCUMENTS

| | | | |
|---|---|---|---|
| 5,768,107 A * | 6/1998 | Ouchi et al. ................. | 361/792 |
| 6,341,053 B1 | 1/2002 | Nakada et al. ............ | 360/324.2 |
| 6,391,658 B1 | 5/2002 | Gates et al. .................... | 438/3 |
| 6,514,647 B1 * | 2/2003 | Hinogami et al. ............ | 430/22 |
| 6,573,586 B2 | 6/2003 | Sakata et al. ................ | 257/529 |
| 6,784,901 B1 * | 8/2004 | Harvey et al. ............... | 715/757 |
| 2002/0195630 A1 | 12/2002 | Sakata et al. ................ | 257/296 |

* cited by examiner

*Primary Examiner*—Phuc T. Dang
(74) *Attorney, Agent, or Firm*—Margaret Pepper; Cantor Colburn LLP

(57) ABSTRACT

A method for aligning an opaque, active device in a semiconductor structure includes forming an opaque layer over an optically transparent layer formed on a lower metallization level, the lower metallization level including one or more alignment marks formed therein. A portion of the opaque layer is patterned and opened corresponding to the location of the one or more alignment marks in the lower metallization level so as to render the one or more alignment marks optically visible. The opaque layer is then patterned with respect to the lower metallization level, using the optically visible one or more alignment marks.

15 Claims, 5 Drawing Sheets

US 6,933,204 B2

METHOD FOR IMPROVED ALIGNMENT OF MAGNETIC TUNNEL JUNCTION ELEMENTS

BACKGROUND OF INVENTION

The present invention relates generally to semiconductor device processing and, more particularly, to a method for improved alignment of magnetic tunnel junction elements.

Magnetic (or magneto-resistive) random access memory (MRAM) is a non-volatile random access memory technology that could potentially replace the dynamic random access memory (DRAM) and flash memory as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is fixed or pinned, while the magnetic moment of the other magnetic layer (also referred to as a "free" layer) may be switched between the same direction and the opposite direction with respect to the fixed magnetization direction of the reference layer. The orientations of the magnetic moment of the free layer are also known as "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is "low" when the magnetization is parallel, and "high" when the magnetization is antiparallel. Accordingly, a detection of changes in resistance allows a MRAM device to provide information stored in the magnetic memory element (i.e., a read operation). In addition, a MRAM cell is written to through the application of a bi-directional current in a particular direction, in order to magnetically align the free layer in a parallel or antiparallel state.

MRAM devices, like semiconductor devices in general, are continually becoming smaller in size and require manufacturing processes that are capable of producing these devices. Alignment techniques are implemented during manufacturing processes in order to ensure correct alignment of the various layers within semiconductor devices. Typically, alignment marks are utilized in the layers to help align the various features.

In the context of MRAM devices, the MTJ stacks require extremely smooth substrates for deposition thereon, in order to create a near-planar tunnel barrier such that the very small coherence lengths of the spin-polarized electrons will be uniform across the device. Since this MTJ stack is non-transparent to light, the lithography on top of this layer requires topographic (rather than material contrast) features for alignment and overlay measurement through the layer. Because the underlying layer is typically chemically mechanically polished (CMP) as a final step before MTJ stack deposition, conventional alignment mark formation in this regard also typically leaves slurry residue trappings from smoothing CMP operations within the alignment mark topography. This (along with dished marks) makes alignment difficult. In addition, across-the-wafer inhomogeneity inherent to most CMP processes leaves uncontrollable amounts of tantalum nitride (TaN) film. This results in device shorting for cross-point array architectures.

SUMMARY OF INVENTION

The foregoing discussed drawbacks and deficiencies of the prior art are overcome or alleviated by a method for aligning an opaque, active device in a semiconductor structure. In an exemplary embodiment, the method includes forming an opaque layer over an optically transparent layer formed on a lower metallization level, the lower metallization level including one or more alignment marks formed therein. A portion of the opaque layer is patterned and opened corresponding to the location of the one or more alignment marks in the lower metallization level so as to render the one or more alignment marks optically visible. The opaque layer is then patterned with respect to the lower metallization level, using the optically visible one or more alignment marks.

In still another aspect, a method for aligning a magnetic tunnel junction (MTJ) element in a semiconductor memory array includes forming an MTJ stack layer over an optically transparent layer formed on a lower metallization level, the lower metallization level including one or more alignment marks formed therein. A portion of the MTJ stack layer is patterned and opened corresponding to the location of the one or more alignment marks in the lower metallization level so as to render the one or more alignment marks optically visible. The MTJ stack layer is then patterned with respect to the lower metallization level, using the optically visible one or more alignment marks.

BRIEF DESCRIPTION OF DRAWINGS

Referring to the exemplary drawings wherein like elements are numbered alike in the several Figures.

DETAILED DESCRIPTION

The alignment of active devices to an associated bitline/wordline underneath the device is a prerequisite for making dense arrays for superior performance of the semiconductor device. For example, in 0.18 micron logic technology, the required alignment is on the order of less than 70 nanometers (nm) for any two layers of the device, in order for the design to work.

MRAM device formation (in particular, magnetic tunnel junction etching) is one example of a non-interconnect, back end of line (BEOL) metal etch. Here, topography from prior levels is undesirable for device functionality. A very rough tunnel junction interface is capable of lowering the signal available for discriminating between the two logic states. However, a very minimal residual topography that is insufficient for precise alignment (10's of nanometers), is available from the CMP processes that create the underlying levels. These levels of wiring are used to carry the currents required to switch the devices. Very precise alignment of the MTJs to these levels is required for tight control of the switching characteristics of the device.

In the formation of MRAM devices, the alignment of the magnetic tunnel junction (MTJ) stacks to the metal line underneath poses a particularly tricky problem since the MTJ stack itself is opaque. Proper alignment, which is achieved through the use of a lithographic stepper prior to printing of the pattern, is based on the accurate detection of reflected light from the alignment structures etched on the layer underneath. The position of the alignment marks is calculated and the wafer is thus positioned accurately on the stage by the stepper feedback mechanism.

Figure 1:
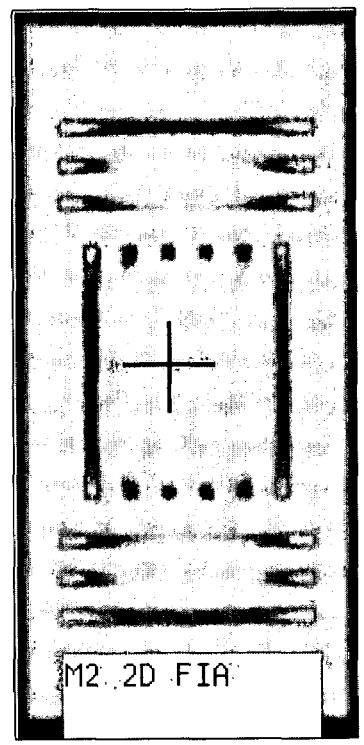
FIG. 1 is a view of a series of conventionally formed alignment marks characterized by dishing.

However, because the MTJ stack materials are opaque, reflected light does not contain information about the underlying alignment structures. Accordingly, one way this problem has been addressed in the past is through the creation of surface topography with the alignment marks, as discussed above, in order to align opaque junctions. The formation of such alignment marks with topographic characteristics can be implemented by etching out copper alignment marks using a tantalum nitride (TaN) hardmask, followed by removal of the TaN by chemical mechanical polishing (CMP), and deposition of the magnetic stack and hardmask layers. The resultant topography on the MTJ stack is employed for alignment. Again, this approach may result in slurry trapping in the alignment marks during prior TaN CMP, thus making alignment rather difficult. In some cases, the alignment marks can become badly dished by non-uniform CMP, thus making it very difficult or impossible to use for alignment purposes, as is illustrated in FIG. 1.

Therefore, in accordance with an embodiment of the invention, there is disclosed a method of alignment of opaque active devices in dense semiconductor arrays wherein alignment marks are utilized optically without any topography, thereby eliminating the above described disadvantages. Briefly stated, a block out mask is formed after the opaque stack is deposited in order to open up alignment marks present thereunderneath, in a manner that they become optically visible to the aligning apparatus.

Figure 2:
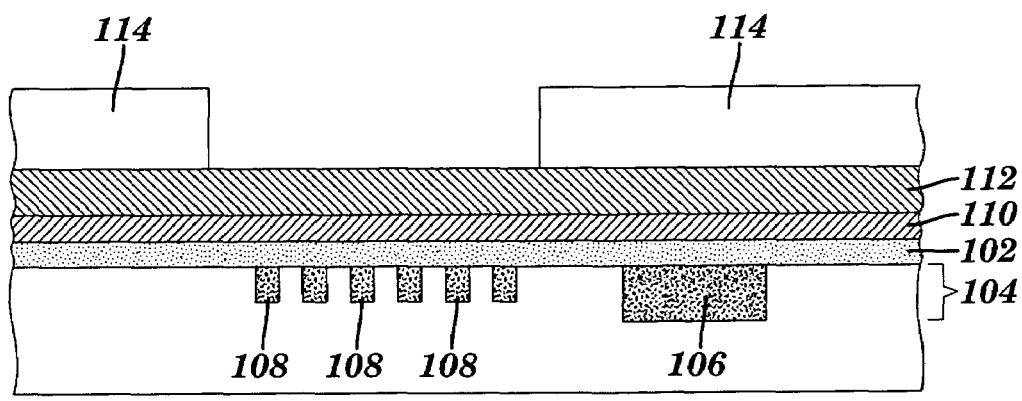
FIG. 2 is a cross-sectional view of a processing stage of an MRAM device, during which a magnetic stack material is deposited for MTJ formation and subsequent alignment to a given metallization level, in accordance with an embodiment of the invention.

Referring now to FIG. 2, there is shown a cross-sectional view of a processing stage of an MRAM device 100, during which the magnetic stack material is deposited for MTJ formation and alignment to a given metallization level. It should be understood that although the alignment methodology presented herein is in the context of MRAM device processing, it is equally applicable to other types of semiconductor structures in which alignment of opaque active elements is carried out. As is particularly shown in FIG. 2, an optically transparent layer 102 of TaN is deposited on top of a metallization level 104 (e.g., M2 or M1 depending on the specific device structure). Shown in the metallization level 104 is an exemplary metal line 106 (e.g., copper) to which the subsequently formed MTJ devices will be aligned, as well as a plurality of metal filled alignment marks 108. The deposition of the TaN layer 102 is followed by the individual layers comprising the opaque MTJ stack layer (denoted collectively at 110), and a hardmask 112 (e.g., titanium nitride (TiN)) to enable etching of the MTJ devices.

Next, a block out mask is used for a lithography step, in which an alignment pattern is opened in a photoresist layer 114, over the top of the alignment marks 108 of metallization level 104. The active device regions of the wafer are protected by photoresist at this stage. This block out mask step need not be aligned using EGA (Enhanced Global Alignment), since the desired tolerance for this purpose is only on the order of microns, as opposed to about 70 nm as in the case of other alignment steps. Accordingly, any generated topography during the formation of metallization level 104 should be sufficient to carry out a coarse alignment of the block out mask. In the case of FET based MRAM device architectures, this alignment may be carried out using prior via level topography.

Figure 3:
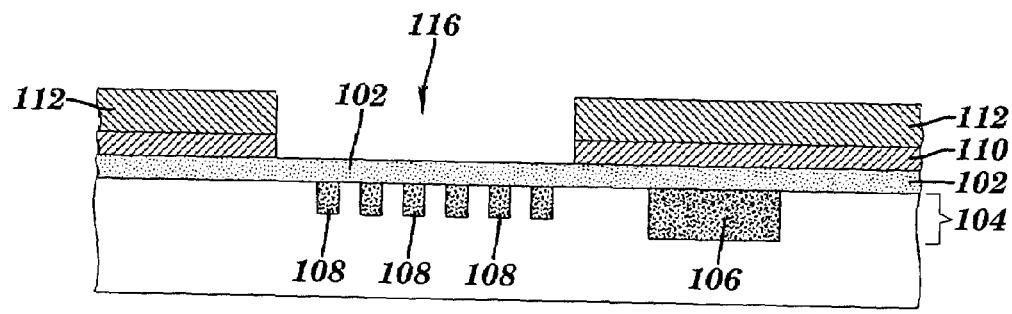
FIG. 3 illustrates the MRAM device following etching of the oxide layer, TiN hardmask and MTJ stack layer according to the pattern shown by the lithography step of FIG. 2.
Figure 4:
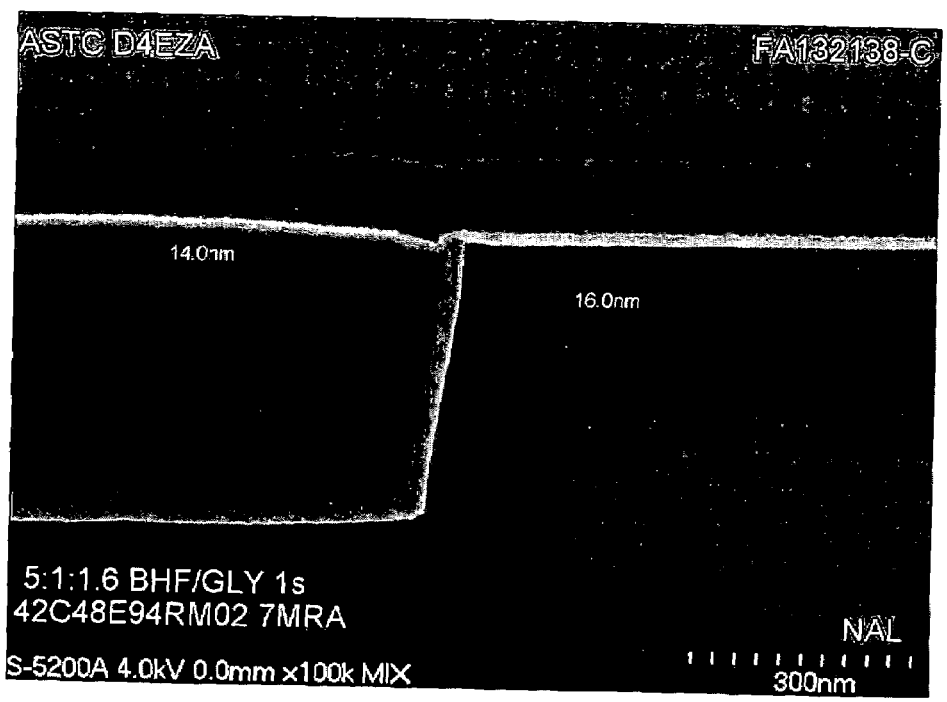
FIG. 4 is an SEM cross-section of an exemplary alignment mark that becomes optically visible through a covering TaN layer, following the hardmask/MTJ stack etch sequence shown in FIG. 3.

As shown in FIG. 3, the pattern printed by the lithography step of FIG. 2 is etched through TiN hardmask 112 and MTJ stack layer 110, thereby opening a window 116 atop the portion of the TaN layer 102 over the alignment marks 108. The TiN hardmask 112 may be opened in a metal etch chamber using a suitable chemistry. Furthermore, the MTJ stack layer 110 may be etched using a suitable chemistry to stop on the TaN layer 102. Thus, at this point during the processing, the alignment marks 108 on metallization level 104 are optically visible through the TaN layer 102. FIG. 4 is an SEM cross-section of an exemplary alignment mark that is optically visible through a covering TaN layer, following the hardmask/MTJ stack etch sequence.

Figure 5:
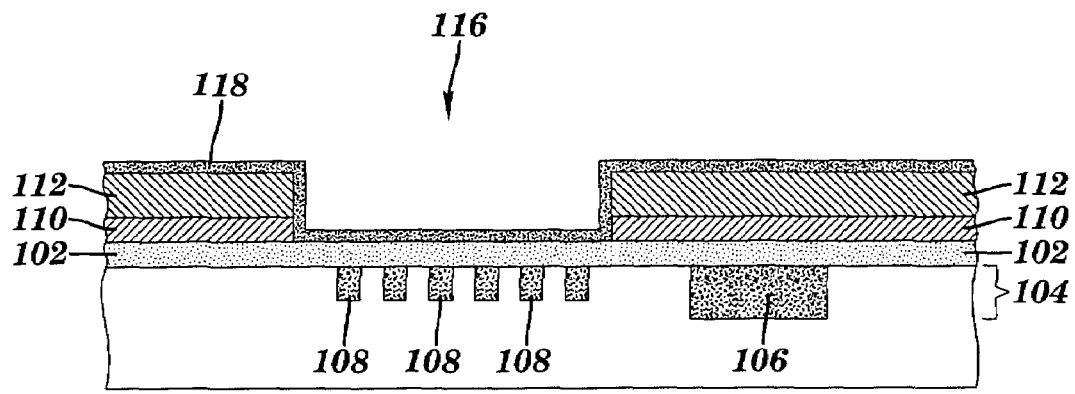
FIG. 5 illustrates a protective oxide hardmask layer that may first be formed over the device prior to the MTJ stack patterning.
Figure 6:
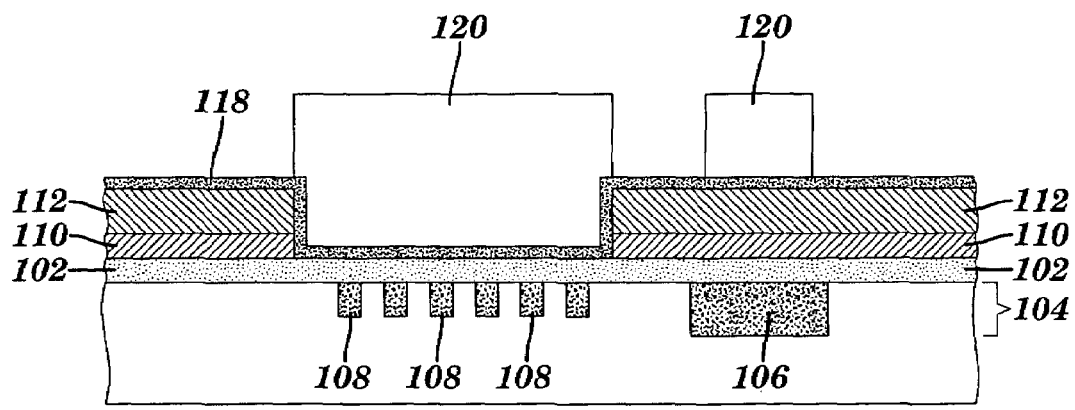
FIG. 6 illustrates MTJ lithography using a modified kerf, wherein the areas previously opened during the etch step(s) of FIG. 3 are also covered with hardened resist.

Since the alignment marks 108 are now visible following the above described etching, the MTJ stack may now be patterned in alignment to better than 70 nm over the metal line 106. During the MTJ device formation, both the patterned MTJ devices and the etched alignment area over the alignment marks 108 will be protected from the MTJ etch by hardened resist. Optionally, a protective oxide hardmask layer 118 may first be formed over the device prior to the MTJ stack patterning, as shown in FIG. 5. The MTJ device lithography is then carried out using a modified kerf, wherein the areas previously opened during the etch step(s) of FIG. 3 are also covered with hardened resist 120 in addition to the MTJ stack area, as shown in FIG. 6. This also serves to protect that portion of the oxide hardmask layer 118 over the alignment marks 108 during the subsequent oxide open portion of the MTJ stack formation.

In order to implement the resist patterning of FIG. 6, a modified MTJ patterning mask is used that serves the dual purpose of patterning the MTJ devices and protecting the exposed kerf area containing the alignment marks 108. Accordingly, during the MTJ patterning (including oxide hardmask opening, TiN hardmask opening and stack patterning), the optional oxide hardmask layer 118 above the alignment marks 108 is protected by resist 120, while during the TiN open process (which employs a Cl chemistry), the copper alignment marks 108 are protected by the oxide/TaN process. Finally, during the MTJ stack etch itself, the TaN layer 102 (and some oxide material, if used) continue to protect the copper alignment marks 108.

Figure 7A:
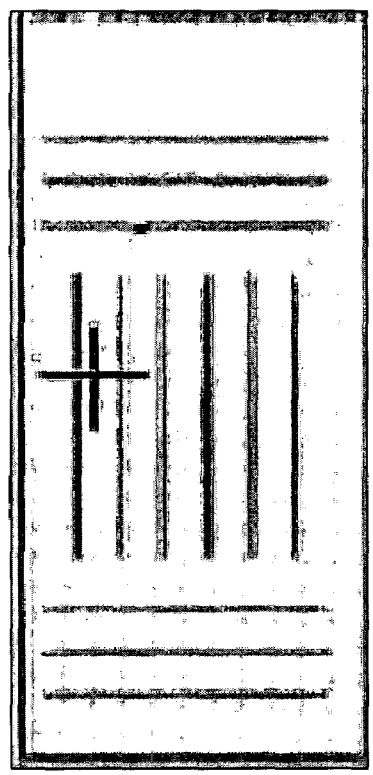
FIGS. 7(a) and 7(b) illustrate exemplary 2D and 1D alignment marks, respectively, opened up using the presently disclosed process.
Figure 7B:
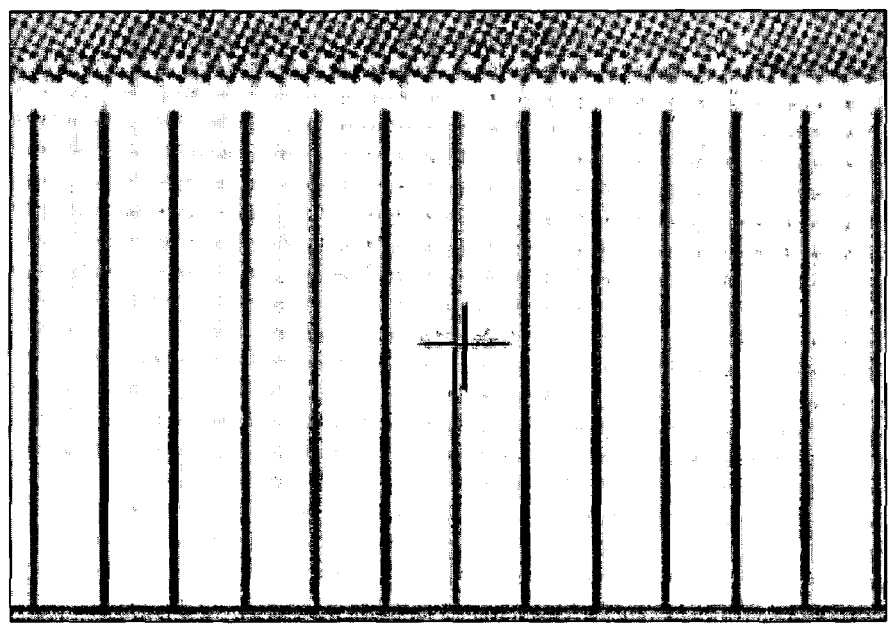
Figure 8:
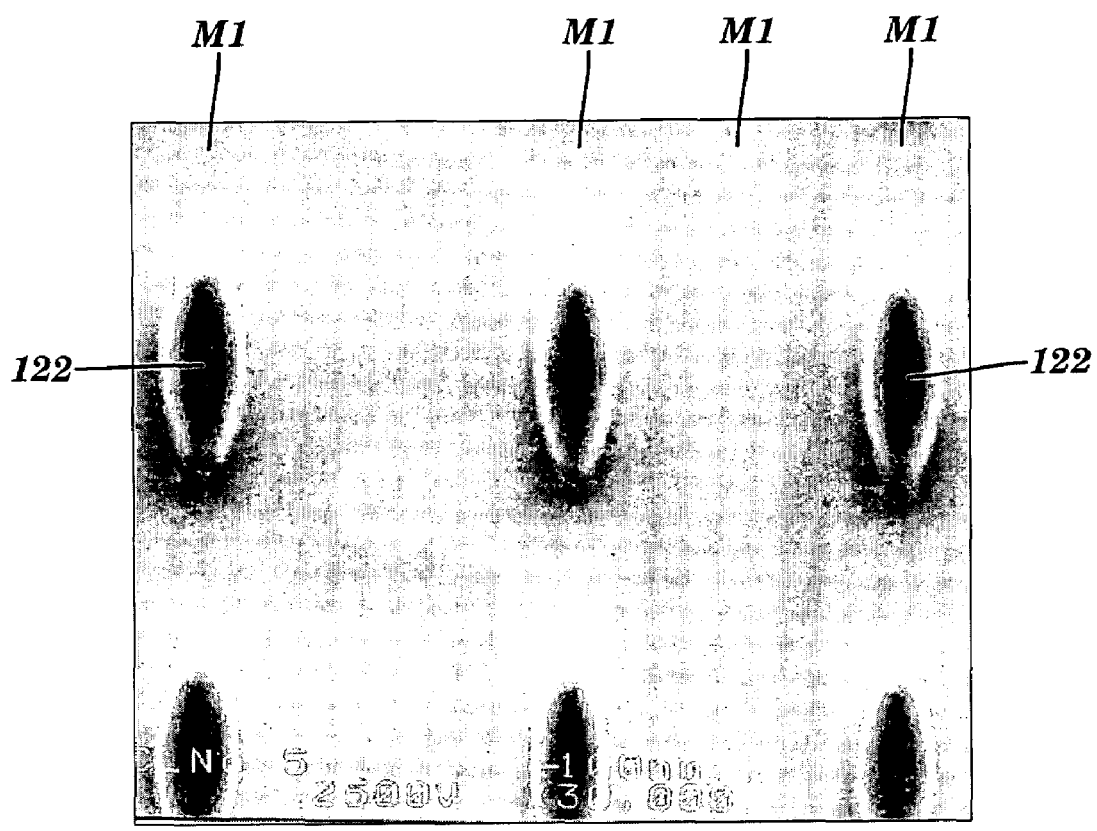
FIG. 8 is an SEM illustrating a plurality of magnetic tunnel junctions aligned and patterned in accordance with an embodiment of the present invention.

As will be appreciated, the alignment of the MTJ devices to the copper alignment marks 108 is now much easier since they are optically visible through the resist and TaN layer 102. FIGS. 7(a) and 7(b) illustrate exemplary 2D and 1D alignment marks, respectively, opened up using the above process. As compared with the dished out topography alignment marks of FIG. 1, the optically visible marks shown in FIGS. 7(a) and 7(b) provide superior stability and alignment capability of opaque materials without resorting to topographic assistance, which is inherently unstable and requires additional etching and CMP steps. Finally, FIG. 8 is an SEM illustrating a plurality of (elliptically shaped) magnetic tunnel junction devices 122 aligned and patterned using the above described process. The wordlines (denoted as M1) may be clearly seen beneath the junctions 122, wherein the alignment thereof is in the order of less than 70 nm between the junctions and the M1 lines.

Through the use of the above described optical alignment process, any active device may be aligned to layers thereunderneath as demanded by design criteria for dense arrays. While particularly suited for MRAM device processing, the method may be extended to any device that is opaque in nature and needs alignment to a prior level, and without the need for special planarization to induce critical topography. In the case of MRAM, this method provides excellent alignment of opaque magnetic tunnel junctions to metal levels underneath, thus allowing for shrinkage of the circuitry. Moreover, this process eliminates the requirement for a thick TaN hardmask during wet etching of topographic alignment marks, as well as an associated CMP to finally reduce the TaN thickness.

Still a further advantage stems from the fact that pad-to-pad shorting of the metal lines underneath the active devices are eliminated, since a TaN hardmask is not required in this scheme. Heretofore, this has been a major yield detractor for cross-point architecture MRAM devices. In addition, for FET-based architectures, the process allows for damascene formation of the local strap level to be in alignment with the metal underneath. This method is also stacking friendly, in the sense that several layers of alternate MTJ and metal wiring lines may be built using this process.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for aligning an opaque, active device in a semiconductor structure, the method comprising:
    forming an opaque layer over an optically transparent layer formed on a lower metallization level, said lower metallization level including one or more alignment marks formed therein; and
    patterning and opening, through topographic alignment, a portion of said opaque layer corresponding to the location of said one or more alignment marks in said lower metallization level so as to render said one or more alignment marks optically visible; and
    patterning said opaque layer with respect to said lower metallization level, using said optically visible one or more alignment marks.

2. The method of claim 1, wherein said optically transparent layer comprises a tantalum nitride (TaN) layer.

3. The method of claim 1, further comprising forming a hardmask over said opaque layer.

4. The method of claim 3, wherein said hardmask further comprises a titanium nitride (TiN) layer.

5. The method of claim 1, wherein a photoresist material used to pattern said opaque layer with respect to said lower metallization level is also used to protect said opened portion of said opaque layer corresponding to the location of said one or more alignment marks.

6. The method of claim 1, further comprising forming an oxide hardmask over an exposed portion of said optically transparent layer as a result of said patterning and opening a portion of said opaque layer.

7. The method of claim 1 wherein said one or more alignment marks comprise copper.

8. A method for aligning a magnetic tunnel junction (MTJ) element in a semiconductor memory array, the method comprising:
    forming an MTJ stack layer over an optically transparent layer formed on a lower metallization level, said lower metallization level including one or more alignment marks formed therein; and
    patterning and opening a portion of said MTJ stack layer corresponding to the location of said one or more alignment marks in said lower metallization level so as to render said one or more alignment marks optically visible; and
    patterning said MTJ stack layer with respect to said lower metallization level, using said optically visible one or more alignment marks.

9. The method of claim 8, wherein said optically transparent layer comprises a tantalum nitride (TaN) layer.

10. The method of claim 8, further comprising forming a hardmask over said MTJ stack layer.

11. The method of claim 10, wherein said hardmask further comprises a titanium nitride (TiN) layer.

12. The method of claim 8, wherein a photoresist material used to pattern said MTJ stack layer with respect to said lower metallization level is also used to protect said opened portion of said MTJ stack layer corresponding to the location of said one or more alignment marks.

13. The method of claim 8, further comprising forming an oxide hardmask over an exposed portion of said optically transparent layer as a result of said patterning and opening a portion of said MTJ stack layer.

14. The method of claim 8, wherein said one or more alignment marks comprise copper.

15. The method of claim 8, wherein said patterning and opening a portion of said MTJ stack layer is implemented through topographic alignment.

* * * * *